United States Patent [19]

Iwamatsu et al.

[11] Patent Number: 5,124,931
[45] Date of Patent: Jun. 23, 1992

[54] METHOD OF INSPECTING ELECTRIC CHARACTERISTICS OF WAFERS AND APPARATUS THEREFOR

[75] Inventors: Masaaki Iwamatsu, Yamanokami; Ryuichi Takebuchi, Nakashimojo; Yoshihito Marumo, Kitakoma; Wataru Karasawa, Yokohama, all of Japan

[73] Assignee: Tokyo Electron Limited, Tokyo, Japan

[21] Appl. No.: 420,525

[22] Filed: Oct. 12, 1989

[30] Foreign Application Priority Data

Oct. 14, 1988 [JP] Japan .................. 63-260244
Nov. 18, 1988 [JP] Japan .................. 63-291718
Jan. 6, 1989 [JP] Japan .................. 64-882

[51] Int. Cl.⁵ .............................. G06F 15/46
[52] U.S. Cl. .............................. 364/489; 364/488; 250/491.1; 356/401; 356/394
[58] Field of Search .......... 364/491, 490, 489, 488; 356/392, 394, 401; 250/491.1; 382/8, 10, 16

[56] References Cited

U.S. PATENT DOCUMENTS

| | | | |
|---|---|---|---|
| 3,751,647 | 8/1973 | Maeder et al. | 364/490 |
| 3,908,118 | 9/1975 | Micka | 364/490 |
| 3,909,602 | 9/1975 | Micka | 364/490 |
| 4,600,996 | 7/1986 | Kawauchi | 364/491 |
| 4,780,617 | 10/1988 | Umatate et al. | 364/491 |

OTHER PUBLICATIONS

"An Automatic Optical Printed Circuit Inspection System" by R. C. Restnick, III, SPIE vol. 116 Solid State Imaging Devices, 1977, pp. 76–81.

Primary Examiner—Parshotam S. Lall
Assistant Examiner—V. N. Trans
Attorney, Agent, or Firm—Oblon, Spivak, McClelland, Maier & Neustadt

[57] ABSTRACT

In a method of inspecting the electric characteristics of wafers, detecting for second and subsequent alignment operations of probe cards is automatically executed. In an apparatus for inspecting the electric characteristics of wafer, different types of wafers can be continuously inspected using the same probe card on the basis of prestored alignment data of each type of wafers.

9 Claims, 7 Drawing Sheets

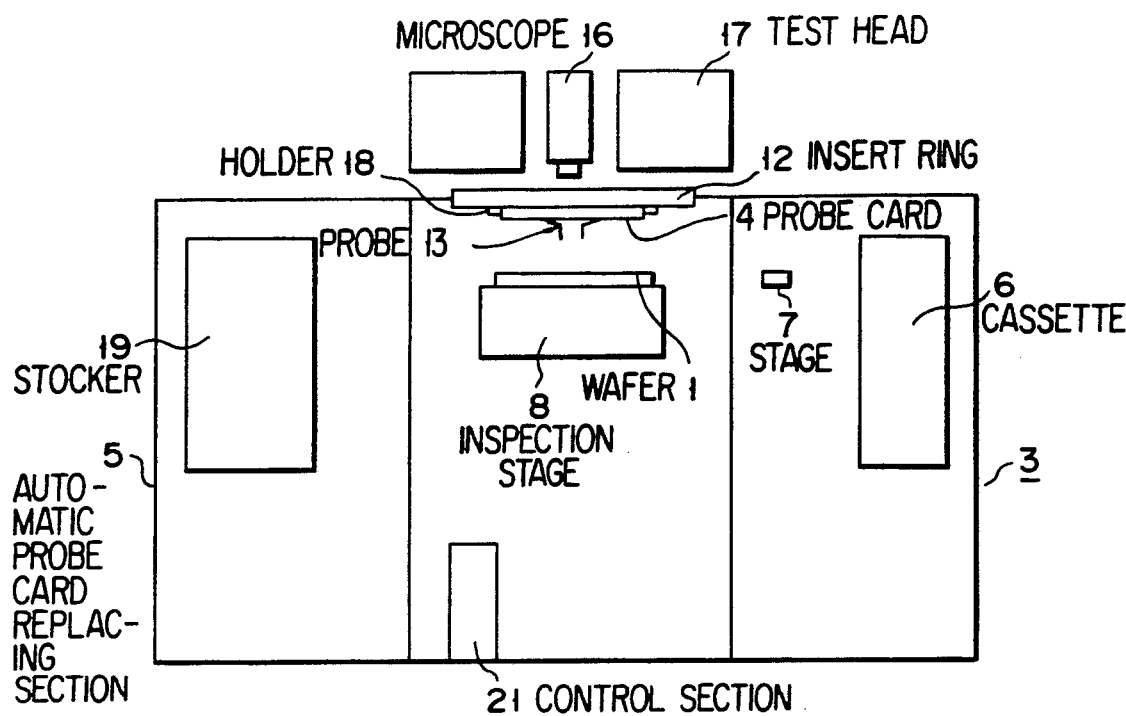
F I G. 1
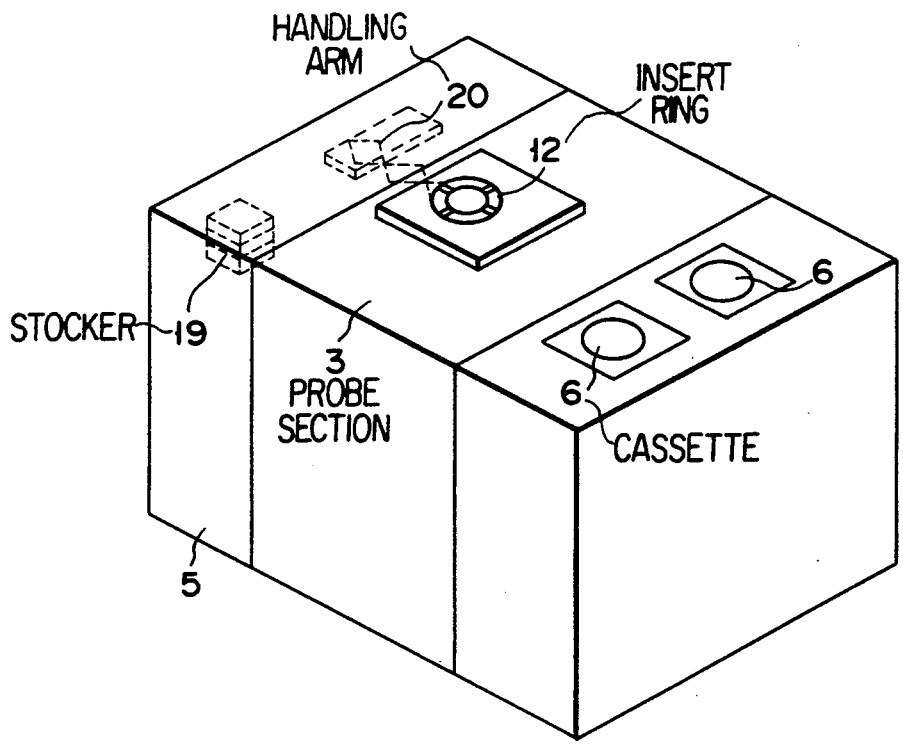
F I G. 2

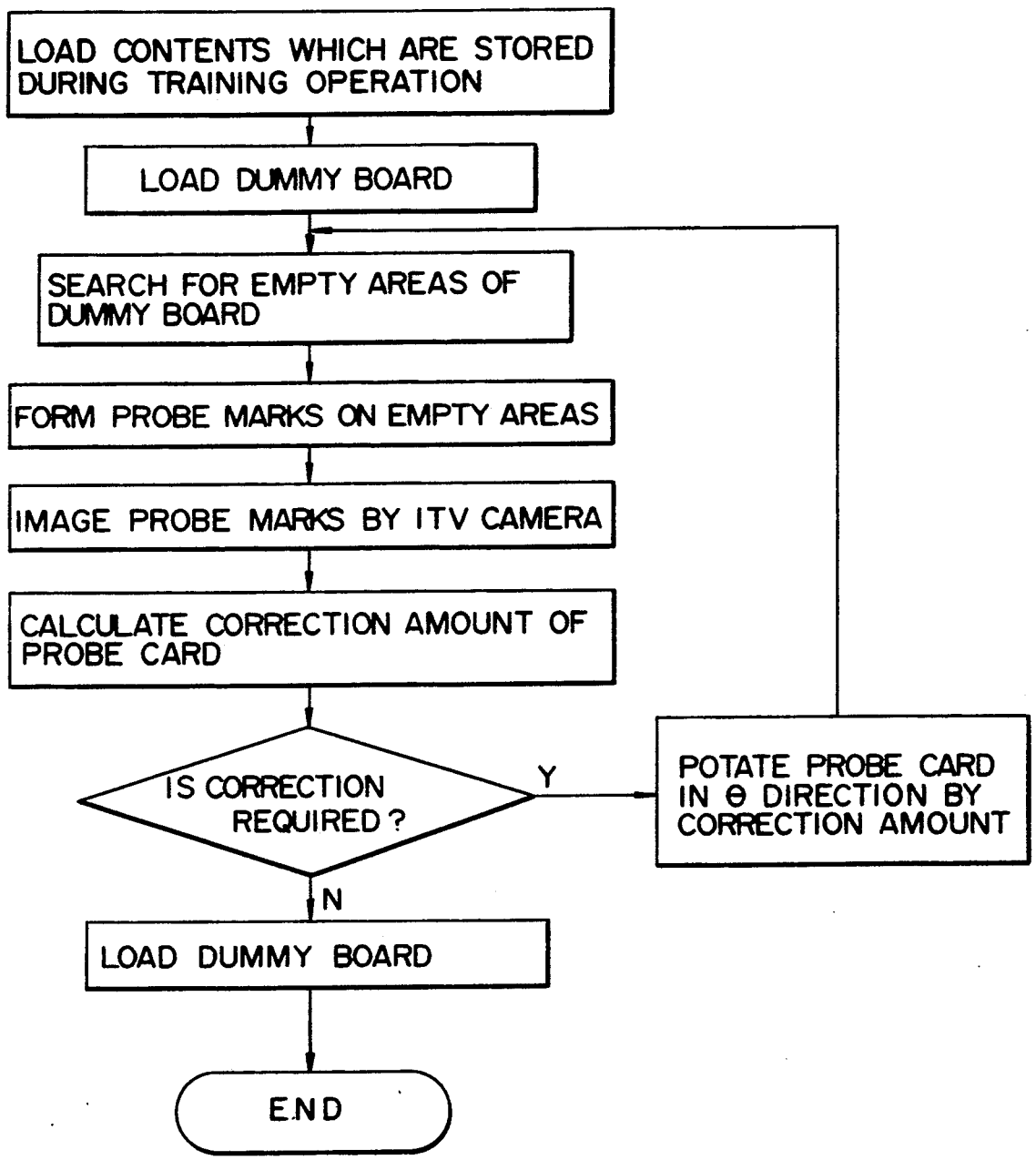
F I G. 8

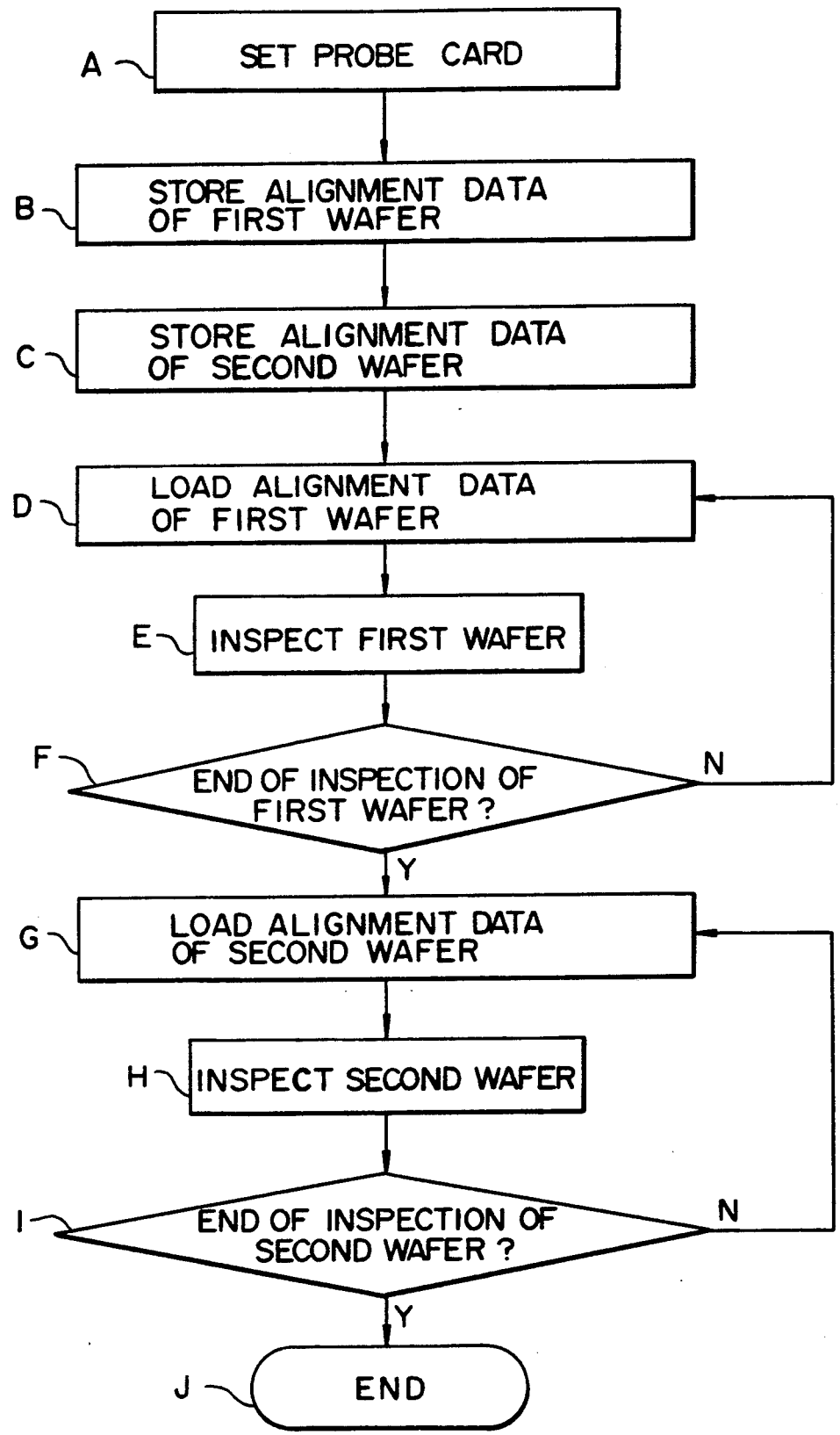
F I G. 9

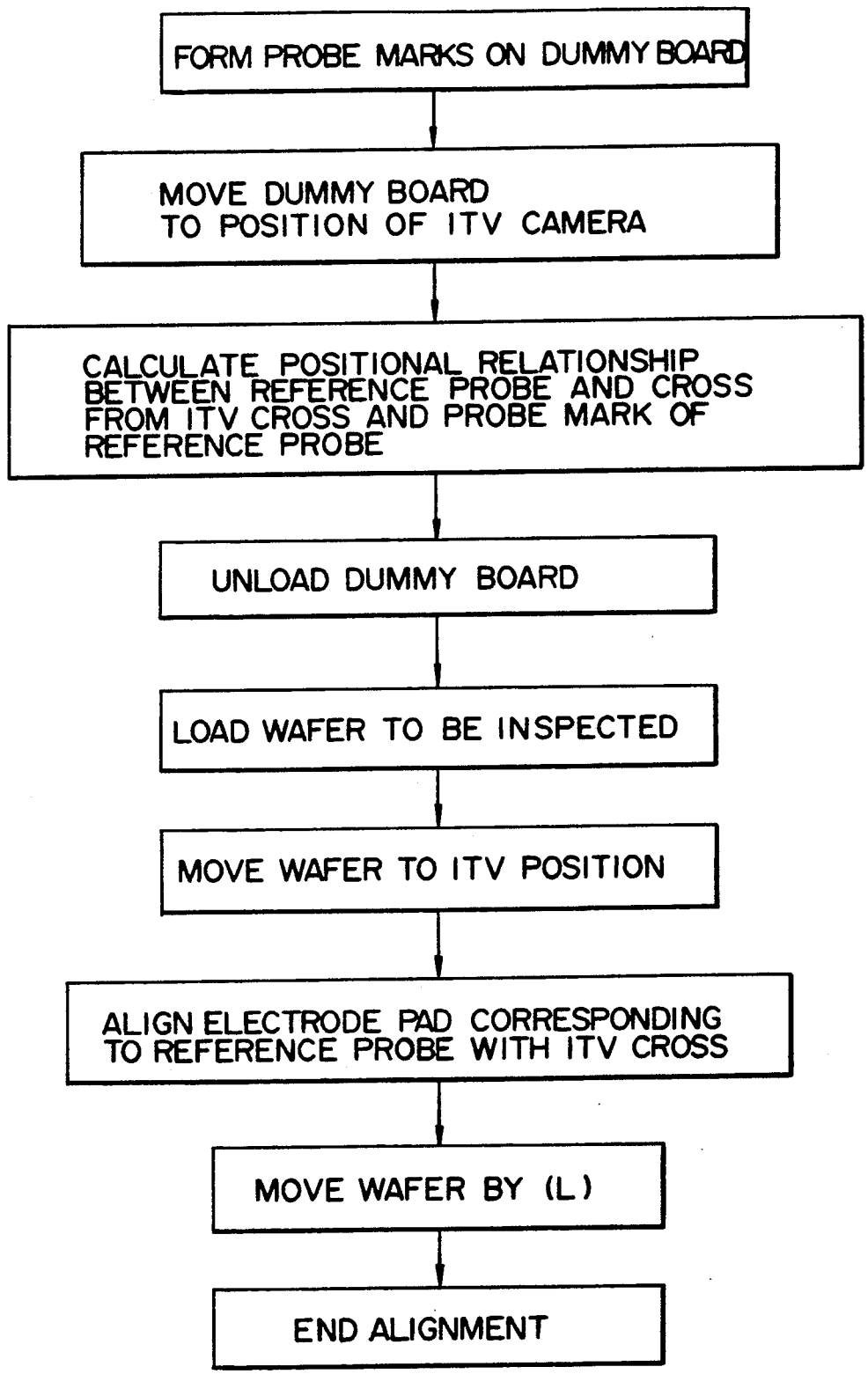
F I G. 11

METHOD OF INSPECTING ELECTRIC CHARACTERISTICS OF WAFERS AND APPARATUS THEREFOR

BACKGROUND OF THE INVENTION

1. Field of the Invention

The present invention relates to a method of inspecting the electric characteristics of wafers and an apparatus therefor.

2. Description of the Related Art

A probe apparatus has been used to inspect the electrical characteristics of IC chips formed on a semiconductor wafer (to be referred to as a wafer hereinafter). IC chips which are determined to be defective by the probe apparatus are removed prior to an assembly process so as to realize a decrease in cost or an increase in productivity in the manufacture of semiconductor devices.

The electric characteristics of a wafer are inspected by the probe apparatus in such a manner that a large number of probes attached to a probe card are respectively brought into contact with electrode pads of IC chips formed on the wafer. In this contact state, the electric characteristics of a given IC chip are inspected by a tester connected to the probe card. Subsequently, a mount table on which the wafer is mounted is moved by a predetermined amount to inspect the next IC chip. Such an operation is repeated to automatically perform continuous inspection of the IC chips formed on the wafer. In order to perform such inspection of the electric characteristics of a wafer by a full automatic operation, probe alignment (teaching operation) must be performed to align the distal end position of each probe with a corresponding electrode pad of each IC chip. Consequently, the probe card is replaced, for each type of wafer, with a new one corresponding to each type of wafer. Therefore, probe alignment must be performed upon each replacement.

The probe apparatus comprises an enlarging mechanism, e.g., a microscope, for enlarging the image of a contact portion between a probe and an electrode pad. Probe alignment is performed such that an operator manually performs fine movement of the mount table on which the wafer is mounted while observing each electrode pad and each probe using this microscope. At this time, $\theta$ alignment of the probe card is also performed.

In the conventional method of inspecting the electric characteristics of wafers, however, an operator manually performs a teaching operation of each probe and each electrode pad in each inspection cycle. For this reason, especially in the manufacture of various types of wafers in small quantities, an operation time for alignment takes a long period of time. In addition, since the number of electrode pads is increased with an increase in integration density of IC chips, alignment becomes more difficult. As a result, the operator requires a longer operation time. For this reason, the operating time of the apparatus is prolonged, and the productivity is lowered. In addition, since alignment is manually performed by an operator, precision varies depending on the skill of each operator, and reliability is impaired. Moreover, if different types of wafers are simultaneously set on the probe apparatus, inspection cannot be continuously performed. Even in different types of wafers, the electrode pads of each IC chip may have the same arrangement. In this case, a single probe card is used. However, since the wafers differ from each other in, e.g., shape, size, or position of IC chips on the wafers, alignment must be performed for each type of wafers. That is, even if the same probe card is used in the manufacture of various type of wafers in small quantities, alignment must be performed every time a type of wafers is changed. Since alignment of wafers needs to be frequently performed in this manner, long-term, continuous automatic inspection cannot be performed, resulting in a decrease in productivity of semiconductor devices.

High-frequency inspection may be performed depending on a type of wafers. In this case, a test head is placed on an upper surface portion of a probe apparatus so as to perform inspection. A microscope is set in an insertion hole formed in the test head. Similarly, in this case, probe alignment is performed in such a manner that an operator manually performs fine movement of a mount table on which a wafer is placed while observing each electrode pad and each probe using a microscope.

A board called a pin electronics board incorporating analog circuits such as a driver and comparator is arranged on a test head to be subjected to high-frequency inspection. Such a test head requires an insertion hole for allowing a microscope to be inserted therein so as to align probes with electrode pads. For this reason, the distance from the wiring of the pin electronics board to each probe is increased to evade the insertion hole. As a result, capacitance and impedance are increased due to the wiring, and hence accurate high-frequency inspection cannot be performed. In addition, if an operator manually performs probe alignment while observing probes and electrode pads through a microscope, probe alignment takes a long period of time. Moreover, precision varies depending on the skill of each operator, and hence reliability is impaired.

SUMMARY OF THE INVENTION

It is an object of the present invention to provide a method of inspecting the electric characteristics of wafers, which can shorten a time for alignment of probes with electrode pads and increase productivity, and an apparatus therefor.

It is another object of the present invention to provide a method of inspecting the electric characteristics of wafers, which allows long-term, continuous automatic inspection of various types of wafers to be manufactured in small quantities and increase productivity, and an apparatus therefor.

It is still another object of the present invention to provide a method of inspecting the electric characteristics of wafers, which allows accurate high-frequency inspection, shortens a time for alignment of probes with electrode pads, and improves reliability, and an apparatus therefor.

According to the present invention, there is 1 provided a method of inspecting the electric characteristics of wafers, comprising the steps of: forming probe marks of probes of a probe card on a dummy wafer; imaging the probe marks; detecting a positional difference between prestored electrode pattern data and the probe mark image formed upon the imaging operation; moving a set position of an object to be inspected by the positional difference to be zero in accordance with the detected value; and inspecting electric characteristics by bringing the probes into contact with electrode portions of the object set at a predetermined position.

In addition, according to the present invention, there is provided an apparatus for inspecting the electric characteristics of wafers, comprising probe mark means for forming probe marks of probes of a probe card on a dummy board; probe mark imaging means for imaging the probe marks; detecting means for detecting a positional difference between prestored electrode pattern data and the probe mark image formed upon the imaging operation; positioning means for moving a set position of an object to be inspected by the positional difference to be zero on the basis of an output signal from the detecting means; and probing operation means for bringing the probes into contact with electrode portions of the object.

Brief Description of the Drawings

FIG. 1 is a view showing an arrangement of an apparatus for inspecting the electric characteristics of wafers according to an embodiment of the present invention;

FIG. 2 is a perspective view of the apparatus in FIG. 1;

FIG. 8 is a view for explaining a sequence of alignment operations of the apparatus in FIG. 1;

FIG. 9 is a view for explaining another sequence of characteristic inspection by means of the apparatus in FIG. 1;

FIGS. 10C and 10D are views for explaining electrode pad arrangement in the wafers; and FIG. 11 is a view for explaining a sequence of alignment operations according to another embodiment of the present invention.

Detailed Description of the Preferred Embodiments

Figure 3:
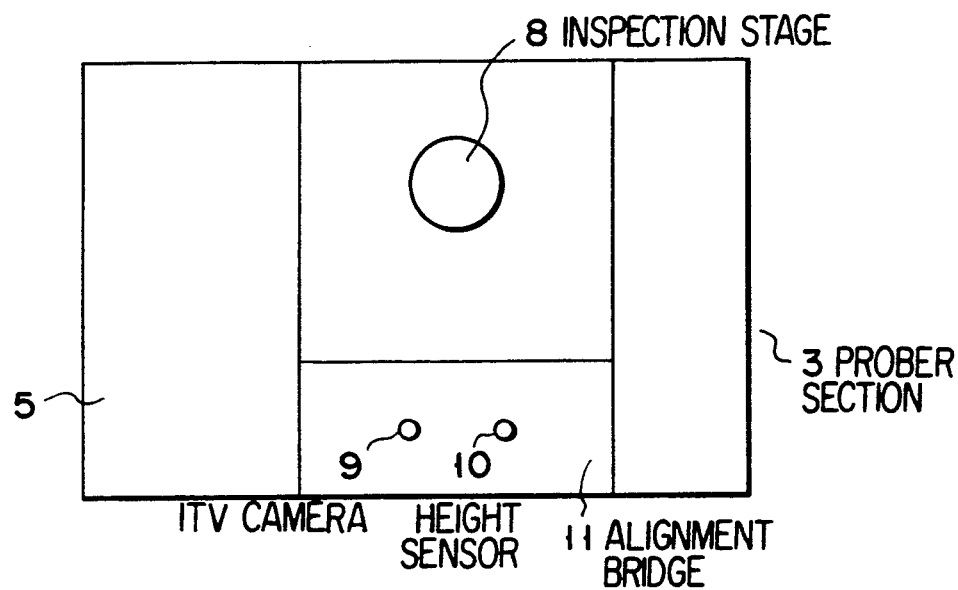
FIG. 3 is a plan view of the apparatus in FIG. 1.
Figure 4:
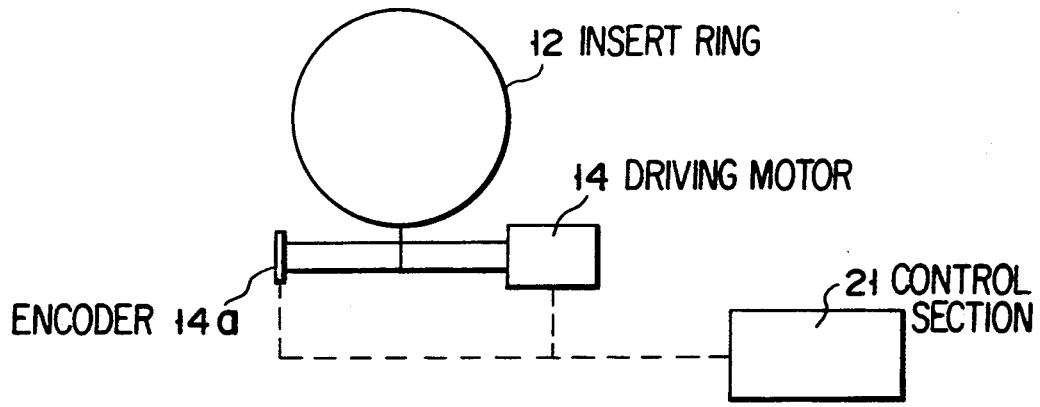
FIG. 4 is a view showing a rotating mechanism of an insert ring of the apparatus in FIG. 1.

Embodiments of the present invention will be described below with reference to the accompanying drawings. First Embodiment FIG. 1 shows an arrangement of an apparatus for inspecting the electric characteristics of wafers according to an embodiment of the present invention. FIG. 2 is a perspective of the apparatus. FIG. 3 is a plan view of the apparatus. FIG. 4 shows a rotating mechanism of an insert ring of the apparatus.

This apparatus comprises a probe operating section for inspecting electric characteristics, a tester section, an automatic probe card replacing section, and an automatic probe card teaching process section. More specifically, a prober section 3 inspects the electric characteristics of an IC chip 2 formed on a semiconductor wafer 1 to be inspected. An automatic replacing section 5 replaces a probe card 4 automatically in accordance with each type of IC chip 2 formed on the wafer 1.

The prober section 3 includes a mount table (not shown) on which semiconductor wafers 1 can be mounted at predetermined intervals in the thickness direction thereof. The mount table is designed to house a cassette 6 in which, for example, 25 wafers 1 can be mounted. A slide arm (not shown) takes out the wafers 1 from the cassette 6 one by one and transfers them to a rotatable, preliminary positioning stage 7. A light-emitting/-receiving sensor is arranged near the stage 7. A rotary transfer arm (not shown) is used to transfer the wafer 1 from the stage 7 to an inspection stage 8. The inspection stage 8 is engaged with motors (not shown) so as to be moved in the X, Y, and Z directions and rotated in the $\theta$ direction about the Z axis. The inspection stage 8 can be manually moved in units of, e.g., $\mu m$ by operating a joystick (not shown). The surface of the inspection stage 8 on which the wafer 1 is mounted is connected to a vacuum unit, and hence the wafer 1 can be vacuum-chucked. As shown in FIG. 3, an ITV camera 9 and a height sensor 10 are arranged on, e.g., an alignment bridge 11. With this arrangement, the wafer 1 mounted on the inspection stage 8 is positioned. The probe card 4 is attached to an insert ring 12 above the inspection stage 8.

A printed board is arranged on the probe card 4. The printed board is obtained by forming a predetermined printed wiring on an insulating board consisting of, e.g., an insulating synthetic resin. Each printed wiring has one terminal to be connected to a tester as a device for inspecting an object to be inspected, and the other terminal to be connected to a probe 13 as a probe terminal. Each probe 13 is connected to a corresponding wiring of an insulating board. That is, the probes 13 correspond to the arrangement of electrode pads 15.

The insert ring 12 to which the above-described probe card 4 is attached can be rotated in the $\theta$ direction together with the probe card 4. As shown in FIG. 4, for example, a driving motor 14 is engaged with the insert ring 12. In addition, an encoder 14a is arranged to detect the rotation amount of the driving motor 14.

With such an arrangement, the insert ring 12 and the probe card 4 can be rotated/adjusted at a resolution of 0.001 degrees in a rotational range of, e.g., 3 degrees. An enlarging mechanism such as a microscope 16 for enlarging the image of a contact portion between each probe 13 and a corresponding electrode pad 15 of the IC chip 2 is arranged above the probe card 4. The prober section 3 has the above-described arrangement.

Note that when the electric characteristics of the semiconductor wafers 1 are to be inspected, since the arrangement of the electrode pads 15 of each type of wafers 1 varies, the probe card 4 needs to be replaced with a new one corresponding to the electrode pad arrangement of each type of wafers.

The automatic probe card replacing section 5 is arranged in a rotating base of a test head 17 used for is fixed, e.g., with screws, to a probe card holder 18 with the position of the probe card 4 being adjusted in advance. The probe card 4 integrally attached to the holder 18 is housed in a stocker 19. The stocker 19 is a housing vessel capable of housing, e.g., 6 types of probe cards at proper intervals in the thickness direction thereof in the form of a vertical array. Each probe card 4 can be set for different types of a plurality of objects to be inspected. A handling arm 20 is arranged in the section 5 so as to take out each prooe card 4 housed in the stocker 19 from a corresponding housing position and to transfer it to a predetermined position. A hold mechanism (not shown) is arranged near the insert ring 12. The hold mechanism can detachably attach the probe card 4 to the insert ring 12.

The automatic probe card replacing section 5 has the above-described arrangement. Operation and setting control of the section 5 are performed by a control section 21 together with the prober section 3.

An operation of the apparatus for inspecting the electric characteristics of wafers will be described below.

One of the probe cards 4 is selected in accordance with the type data of the wafer 1 programmed in a storage mechanism of a CPU. Subsequently, the handling arm 20 transfers the selected probe card 4 to the insert ring 12 of the prober section 3. The probe card 4 is fixed to the insert ring 12 by the hold mechanism (not shown).

Figure 5:
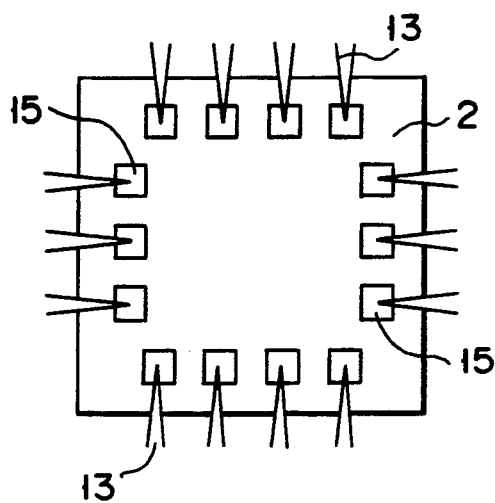
FIG. 5 is a view showing a contact state between the electrode pads of an IC chip and probes in the apparatus in FIG. 1.

In the prober section 3, inspection of the semiconductor wafer 1 is executed by the probe card 4 set in this manner. In this case, as shown in FIG. 5, the probes 13 mounted on the probe card 4 are respectively brought into contact with the electrode pads formed on the IC chip in accordance with their arrangement pattern. In this case, accurate alignment is performed as follows.

A teaching (training) operation as a fundamental operation will be described first.

This training operation is performed to form reference data. With this operation, if a semiconductor wafer 1 and a corresponding probe card 4 are of a new type, second and subsequent alignment operations of electrode pads 5 with probes 13 can be automatically performed in accordance with the first reference data gotten by manual operation.

Figure 6:
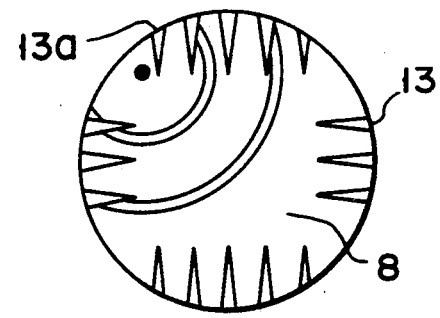
FIGS. 6 and 7 are views for explaining a teaching operation of the apparatus in FIG. 1.

This reference data is stored and stocked together with a probe card code. With this operation, subsequent teaching is automated. A probe card 4 of a new type is set in the insert ring 12. This setting is performed by the automatic probe card replacing section 5. At this time, positioning is roughly performed by using reference pins (not shown) formed on the insert ring 12 and reference holes (not shown) formed in the probe card 4. Subsequently, an operator moves the inspection stage 8 by operating the joystick (not shown) while observing with the microscope 16, thus aligning a reference probe 13a of the probe card 4 with the center of the inspection stage 8, as shown in FIG. 6. The position of the inspection stage 8 at this time is stored. Thereafter, a dummy board 22 is loaded on the inspection stage 8. The dummy board 22 is obtained by depositing aluminum on one surface of a semiconductor wafer. The dummy board 22 is moved to a position opposite to the installation position of the ITV camera 9, and empty areas are searched. That is, portions of the dummy board 22 on which no probe marks are formed are searched to evade previously used portions.

Figure 7:
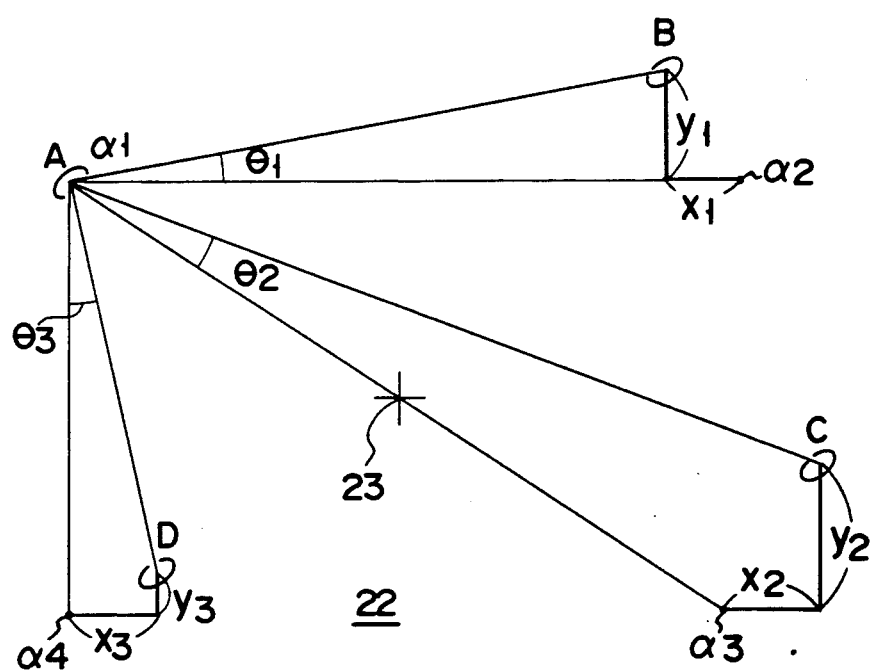
Figure 10A:
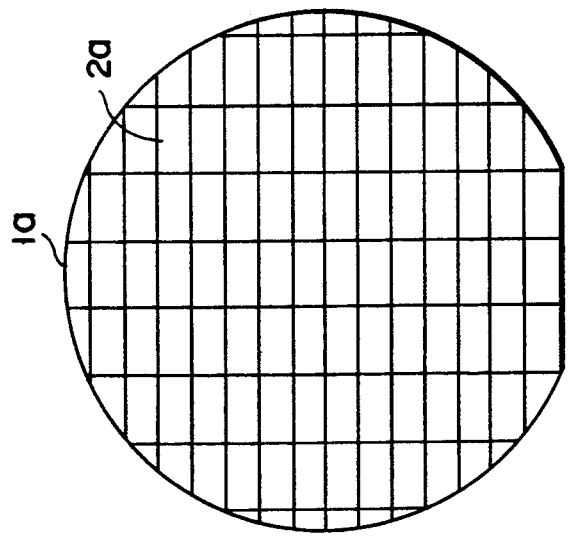
FIGS. 10A to 10D are views for explaining an arrangement and the like of different types of wafers having the same electrode pad arrangement used in the sequence in FIGS. 9, 10A and 10B are views for explaining different types of wafers.
Figure 10B:
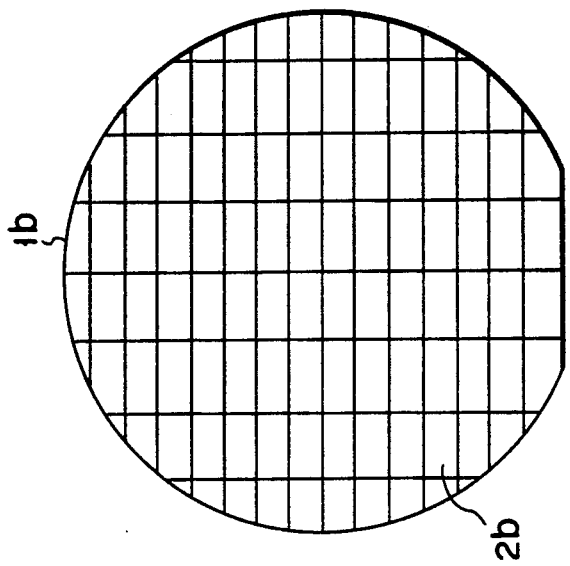
Figure 10C:
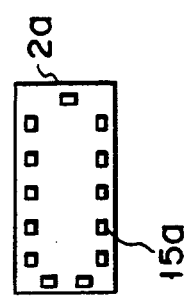
Figure 10D:
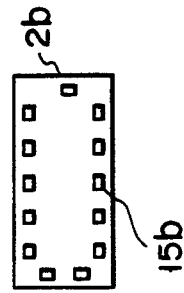

The empty areas are respectively set at the opposite positions of the probes 13. At this time, the inspection stage 8 is raised, and the probe marks of the probes 13 are respectively formed on the empty areas of the dummy board 22. In this case, the probe marks are formed such that the contact pressures of the probes 13 become the same as those in actual inspection. For example, the contact positions are detected by a contact type sensor such as a profiler, and the overdrive amount upon detection is set to be same as that in an actual inspection. The dummy board 22 on which the probe marks are formed is then moved into the field of view of the ITV camera 9. Portions near the probe marks are imaged by the ITV camera 9. FIG. 7 shows the resultant image, in which the probe marks imaged by the ITV camera 9 are respectively denoted by reference symbols A, B, C, and D.

In this state, the operator moves the inspection stage 8 by operating the joystick so as to align a cross 23 representing the center of the ITV camera 9 with the probe mark A made by the reference probe 13a. This position $\alpha_1$ is stored. On the basis of the position $\alpha_1$, the respective probe positions in a state wherein the $\theta$ direction of the probe card 4 is accurately aligned with that of the dummy board 22 are assumed to be positions $\alpha_2$, $\alpha_3$, and $\alpha_4$.

After this operation, the inspection stage 8 is automatically translated, and the cross 23 is set at the assumed position $\alpha_2$. The movement amount at this time is stored beforehand. If the cross 23 of the ITV camera 9 coincides with the probe mark B after the above-described movement, the $\theta$ direction of the probe card 4 is aligned with that of the dummy board 22.

If the cross 23 and the probe mark B do not coincide with each other, the $\theta$ direction of the probe card 4 is shifted from that of the dummy board 22. In this case, the operator aligns the cross 23 with the actual probe mark B using the joystick. With this operation, an absolute position $(x_1,y_1)$ of the probe mark B and the assumed position $\alpha_2$ and $\angle B\alpha_1\alpha_2 = \theta_1$ are calculated. Similarly, the following absolute positions and angles with respect to the probe marks C and D are calculated: an absolute position $(x_2,y_2)$ of the probe mark C and the assumed position $\alpha_3$ and $\angle C\alpha_1\alpha_3 = \theta_2$; and an absolute position $(x_3,y_3)$ and $\angle D\alpha_1\alpha_4 = \theta_3$.

A correction amount of the probe card 4 is calculated on the basis of the calculated values according to the following equation (1):

$$\text{correction amount} = \{(\text{maximum values of } \theta_1, \theta_2, \text{ and } \theta_3) + (\text{minimum values of } \theta_1, \theta_2, \text{ and } \theta_3)\}/2 \qquad (1)$$

The motor 14 engaged with the insert ring 12 is rotated in accordance with the correction amount obtained by equation (1), and alignment of the probe card 4 in the $\theta$ direction is executed. In order to confirm that the probe card 4 is set at the correct position upon the above correction, the probe marks of the probes 13 are formed on the empty areas of the dummy board 22 and a correction amount is calculated in the same manner as described above. If the values $x_1$, $x_2$, and $x_3$, and the values $y_1$, $y_2$, and $y_3$ obtained at this time respectively fall within predetermined ranges of errors, it is determined that the 8 direction of the probe card 4 is aligned with that of the dummy board 22. If the above values fall outside the predetermined ranges of errors, the above correction amount calculation is repeated until the $\theta$ direction of the probe card 4 is aligned with that of the dummy board 22.

Subsequently, correction of the X/Y position is performed in accordance with the following equations (2). For example, correction is performed on the basis of a card position obtained by probe mark detection of the reference probe 13a, a distance (x,y) between optical systems, and a probe mark shift amount of another probe 13 with respect to the reference probe 13a.

$$X = \{x + \{(\text{maximum values of } x_1, x_2, \text{ and } x_3)\} + (\text{minimum values of } x_1, x_2, \text{ and } x_3)\}/2$$

$$Y = \{y + \{(\text{maximum values of } y_1, y_2, \text{ and } y_3)\} + (\text{minimum values of } y_1, y_2, \text{ and } y_3)\}/2 \qquad (2)$$

The values obtained by equations (2) are stored.
That is, a so-called teaching operation is completed.

The dummy board 22 is then unloaded, and a wafer 1 to be inspected is loaded on the inspection stage 8. Macroscopic θ alignment of the X/Y direction of the wafer 1 with that of the inspection stage 8 is performed with reference to a scribe line or the like of the wafer 1. Subsequently, microscopic θ alignment is performed with higher precision.

The wafer 1 is set at a position opposite to the ITV camera 9. At this position, an arbitrary point of an IC chip 2 is stored by the ITV camera 9. As a result, the distance from the arbitrary point to the reference probe 13a is determined. At the same time, image data is stored. The inspection stage 8 is moved by a distance corresponding to the size of chips, and the position is imaged by the ITV camera 9. A parallelism is detected by comparing the output from the camera 9 with the stored image data. By repeating this operation, the above-described microscopic θ alignment is completed. The inspection stage 8 is then moved by the obtained distance between the arbitrary point and the reference probe 13a so as to set the wafer 1 below the probe card 4. The operator aligns the probes 13 of the probe card 4 with the electrode pads of the IC chip by operating the joystick while overserving with the microscope 16, as shown in FIG. 5. This movement amount is stored.

The information in the training operation is stored in this manner as reference data.

An inspecting operation of a semiconductor wafer 1 will be described below.

In the prober section 3, an object to be inspected, e.g., a semiconductor wafer 1, which is stored in the cassette 6 is mounted on the preliminary positioning stage 7. The stage 7 is then rotated to perform preliminary alignment of the wafer with reference to the orientation flat of the wafer 1 with a precision of about ±1°. Thereafter, the wafer 1 is transferred to the inspection stage 8. In this case, the pattern of the wafer 1 is accurately aligned with the reference, and the wafer 1 is set at a position opposite to the probe card 4 by a predetermined operation. The inspection stage 8 is raised to bring the electrode pads 15 of the IC chip 2 formed on the wafer 1 into contact with the probes 13 perpendicularly formed on the probe card 4. In this state, the electric characteristics of the IC chip are measured by the tester (not shown). The above-described inspecting operation is repeated to complete inspection of wafers of the corresponding type. Thereafter, the probe card 4 is replaced with a new one corresponding to the next type of wafers. The above-described training operation is performed with respect to the new probe card 4, and an inspection operation is executed.

If the probe card 4 is replaced with the one for which a training operation was performed, alignment of the probes of the probe card 4 with the electrode pads 15 of an IC 2 formed on a wafer 1 can be fully automatically performed. This operation will be described below with reference to a flow chart shown in FIG. 8.

The contents stored at the time of training of the new probe card 4 are loaded. The dummy board 22 is loaded on the inspection stage 8. The inspection stage 8 is moved, and empty areas of the dummy board 22 are searched with the ITV camera 9. The searched empty areas of the dummy board 22 are respectively set at positions opposite to the probes 13 of the probe card 4. The inspection stage 8 is raised, and the probe marks of the probes 13 are formed on the empty spaces of the dummy board 22. Subsequently, the dummy board on which the probe marks are formed is moved into the field of view of the ITV camera 9. Portions near the probe marks are imaged by the ITV camera 9. The probe mark A of the reference probe 13a is searched with the ITV camera 9. The cross 23 of the ITV camera 9 is aligned with the probe mark A, and this position is stored. Thereafter, the probe marks B, C, and D are searched with the ITV camera 9, and the respective assumed positions and absolute positions are calculated in the same manner as in the training operation. The calculation results are then substituted into equation (1) to obtain the θ correction angle of the probe card 4. As a result, the probe card 4 is rotated by the motor 14 engaged therewith in the θ direction by the obtained correction amount. Thereafter, the probe marks of the probes 13 are formed on the empty areas of the dummy board 22 again, and calculation of a correction amount is performed in the same manner as described above. If the values obtained at this time fall within predetermined ranges of errors, it is determined that the θ direction of the probe card 4 is aligned with that of the dummy board 22. If the errors exceed the predetermined ranges, the above-described correction amount calculation is repeated until the θ direction of the probe card 4 is aligned with that of the dummy board 22.

The values obtained in the above operation are substituted into equations (2) so as to perform correction of the X/Y direction of the probe card 4.

In this manner, θ alignment of the probe card 4 can be accurately performed. That is, the arrangement direction of the probes 13 formed on the probe card 4 can be aligned with the X/Y direction of the inspection stage 8.

Subsequently, the dummy board 22 is unloaded, and a wafer 1 to be inspected is loaded on the inspection stage 8. Macroscopic θ alignment of the X/Y direction of the wafer 1 with the moving direction of the inspection stage 8 is performance with reference to a scribe line or the like of the wafer 1. More accurate θ alignment is performed next. For example, microscopic θ alignment is performed with reference to image data stored at the time of training.

Alignment of the probes 13 of the probe card 4 with the electrode pads of the IC chip 2 is automatically performed on the basis of the distance from the arbitrary point of the IC ship 2, which is stored at the time of training, to the reference probe 13a, and the distance by which the inspection stage 8 is moved when the operator aligned the probes 13 with the electrodes pads 15 by using the joystick upon movement by the above distance.

Subsequently, a normal operation of the probe apparatus is performed to inspect the wafer 1 to be inspected.

In the above embodiment, an aluminum-deposited wafer is used as a dummy board. However, the present invention is not limited to the aluminum-deposited wafer, and any board may be used as long as probe marks can be formed on it.

In addition, in the above embodiment, θ alignment is performed by recognizing the four probe marks formed on the dummy board. However, the present invention is not limited to this. θ alignment may be performed by recognizing at least two probe marks.

Moreover, in the above embodiment, a semiconductor wafer is exemplified as an object to be inspected. However, the present invention is not limited to this, but can be applied to a liquid crystal board, a printed board, or the like.

As has been described above, according to this embodiment, prior to the use of a new type of probe card, reference data required for alignment of the probes of the probe card with the electrode pads of an object to be inspected is stored. When the probe card of the same type is to be used in the subsequent operations, the probe marks of the probes are formed on a dummy board, and the positions of the probe marks are recognized. With this operation, alignment of the probes with the electrode pads can be automatically performed on the basis of the recognized positions and the probe information of the probes as the stored reference data. Since alignment can be performed without a manual operation, an alignment time can be greatly shortened. As a result, productivity can be increased.

In addition, even if different types of wafers are continuously set, corresponding probe cards can be automatically set, and probe alignment can be automatically performed. Hence, inspection can be continuously performed without an operation by an operator.

Second Embodiment

A method according to another embodiment of the present invention will be described below.

This method employs an apparatus for inspecting the electric characteristics of wafers, which has the same arrangement as that of the apparatus of the above-described embodiment (first embodiment). Some IC chips 2 formed on semiconductor wafers 1 of different types may have electrode pads 15 of the same arrangement pattern. In this case, the same probe card 4 is set in the probe apparatus, and only the contents to be inspected by a tester are changed.

A method of continuously and automatically inspecting different types of wafers, e.g., two types of wafers 1a and 1b on which IC chips 2a and 2b having the same electrode pad (15a, 15b) arrangement pattern, as shown in FIG. 18, will be described below with reference to a flow chart shown in FIG. 9.

The first and second wafers 1a and 1b are set in a wafer cassette 6. The second wafer 1b has the same electrode pad arrangement as the electrode arrangement (15a) of the IC chip 2a formed on the first wafer 1a, but is of a type different from that of the first wafer 1a. The numbers and inspection orders of the wafers 1a and 1b are stored beforehand in a storage section, e.g., a hard disk, incorporated in the probe apparatus. The wafer cassette 6 in which the wafers 1a and 1b are housed is mounted on a cassette mount table (not shown) by, e.g., an operator or a robot hand.

A probe card 4 corresponding to the wafers 1a and 1b is selected on the basis of the type data of the wafers 1a and 1b. Automatic replacement of the probe card 4 is performed in the same manner as in the first embodiment (step A). Replacement of this probe card 4 may be manually performed by the operator.

An alignment operation for alignment of the electrode pads 15a with probes 13, determination of inspection areas, and the like is performed first with respect to the first wafer 1a. In this case, if the same teaching operation as in the first embodiment was previously performed, alignment is performed on the basis of the stored data at that time. If no teaching operation was performed, a teaching operation is performed prior to alignment. The alignment data at this time is stored (step B).

In this case, the same probe card is used for the first and second wafers 1a and 1b. However, since the wafers 1a and 1b differ from each other in shape and size, and the positions of the IC chips formed on respective wafers differ from each other, alignment of the second wafer 1b is also performed. Alignment of the second wafer 1b is performed in the same manner as in alignment of the first wafer 1a, and the alignment data at this time is stored (step C).

Upon completion of alignment of the wafers 1a and 1b, inspection is started.

When inspection of the first wafer 1a is to be performed, alignment is performed in accordance with the first alignment data stored beforehand (step B).

The first wafer 1a housed in the cassette 6 is mounted on a preliminary positioning stage 7. The stage 7 is rotated to perform alignment of the first wafer 1a with reference to the orientation flat of the wafer 1a with a precision of about ±1°. Thereafter, the first wafer 1a is transferred to an inspection stage 8. In this case, the X/Y direction of the inspection stage 8 is aligned with that of a scribe line of the wafer 1a with reference to the pattern of the wafer 1a. At the same time, the alignment data of the first wafer 1a stored in the above operation (step B) is loaded (step D).

With this operation, the electrode pad (15a) arrangement of the IC chip 2a of the first wafer 1a is aligned with the probe (13) arrangement of the probe card 4. The first wafer 1a placed at a position opposite to the probe card 4 is raised to respectively bring the electrode pads 15a of the IC chip 2a formed on the first wafer 1a into electric contact with the probes 13 of the probe card 4. The electric characteristics of the IC chip 2 are inspected by a tester (not shown) in this state (step E). The above operation is repeated to complete inspection of the IC chips 2a formed on the first wafer 1a, and the first wafer 1a is unloaded.

It is checked whether any other first wafers 1a to be inspected are present (step F).

If a first wafer 1a to be inspected is present, inspection is performed by repeating the above-described operation (steps D and E). If no first wafers 1a to be inspected are present, inspection of the second wafer 1b is started. In inspection of the second wafer 1b, the prestored alignment data (step C) is loaded (step G) first as in the inspection of the first wafer 1a, and the electrode pad (15b) arrangement of the IC chip 2b of the second wafer 1b is aligned with the probe (13) arrangement of the probe card 4. Similar to inspection of the first wafer 1a, inspection of the second wafer 1b is performed by bringing the probes 13 into contact with the electrode pads 15b, respectively (step H). After inspection of the IC chips 2b formed on the second wafer 1b, the second wafer 1b is unloaded.

It is checked whether any other second wafer 1b to be inspected are present (step I). If a second wafer 1b to be inspected is present, inspection is performed by repeating the above-described operation (steps H and I). If no second wafers 1b to be inspected are present, inspection is completed (step J).

In the above-described embodiment, alignment of the probes of a probe card with the electrode pads of an IC chip formed on a wafer is performed by using a dummy board similar to the one described in the first embodiment. However, the present invention is not limited to this. For example, an operator may perform alignment of probes with corresponding electrode pads by moving the inspection stage while observing with a microscope. In this case, since a dummy board, or an apparatus or software for probe mark recognition can be omitted, the cost of the apparatus is greatly decreased.

In the above embodiment, in the description on inspection of different types of wafers having IC chips of the same electrode pad arrangement, continuous inspection of two types of wafers is exemplified. However, the present invention is not limited to this, and can be applied to inspection of wafers of three types or more. In this case, similar to the above-described embodiment, alignment of each type of wafers is performed prior to inspection, and each alignment data is stored. By loading the stored alignment data, continuous automatic inspection of the respective types of wafers can be performed.

In addition, in the above-described embodiment, different types of wafers are set in the same cassette. However, the present invention is not limited to this, and different types of wafers can respectively set in different cassettes.

As has been described above, according to the above embodiment, when different types of wafers are to be inspected by using the same probe card, alignment data corresponding to each type is stored beforehand, so that continuous inspection of the different types of wafers can be automatically performed by executing inspection after performing alignment in accordance with the pre-stored alignment data of each type of wafers. Therefore, long-term, continuous automatic inspection can be performed with respect to various types of products in small quantities, thus increasing productivity.

Third Embodiment

Still another embodiment of the present invention will be described below. This embodiment also employs an apparatus for inspecting the electric characteristics of wafers, which has the same arrangement as that of the one used in the first embodiment.

In this embodiment, reference data is obtained by storing data upon teaching in the same manner as in the first embodiment. As shown in FIG. 11, alignment is performed first without using a microscope. Subsequently, the electric characteristics of a wafer 1 are inspected as follows.

An inspection stage 8 on which the wafer 1 is mounted is vertically raised to bring electrode pads 15 of an IC chip 2 into contact with corresponding probes 13. In this contact state, inspection of the electric characteristics of each IC chip is performed by a test head 17.

In this case, since the wiring distance between the test head 17 and a probe card 4 is short, high-frequency inspection can be performed more accurately.

The above-described inspection is repeated to complete the inspection. Thereafter, the probe card 4 is replaced with another corresponding to the next type of wafers. After the above-described teaching operation is also performed with respect to the new probe card 4, inspection is executed.

If the probe card 4 is replaced with another for which teaching was performed in the past, alignment of probes 13 with electrode pads 15 is automatically performed in accordance with the stored contents of the teaching operation.

As has been described above, according to this embodiment, in order to align the probes of a probe card with the electrode pads of an object to be inspected, the probe apparatus requires no microscope, and can be decreased in cost and size.

With this arrangement, no microscope insertion hole needs to be formed in a test head for high-frequency inspection, and hence the internal wiring of the test head can be shortened. Since the distance between the test head and each probe card can be shortened, high-frequency inspection can be performed more accurately.

Moreover, since the operation of an operator can be minimized in an alignment operation, a time for alignment can be shortened and its reliability can be increased.

What is claimed is:

1. A method of inspecting electrical characteristics of semiconductor chips on a wafer by use of a probe apparatus which has a mount for mounting the wafer and moving it in first and second directions, perpendicular to each other, on a plane parallel to the main surface of the wafer, a probe card having probes arranged in correspondence to electrode portions of each chip, and support means for detachably securing the probe card, the method comprising the steps of:

attaching the probe card to the support means;
   loading a dummy substrate onto the mount;
   forming probe marks on the dummy substrate by bringing the probes into contact therewith;
   imaging the probe marks in order to obtain a probe mark image;
   comparing the real position of the probes, obtained from the probe mark image, with a prestored reference position of the probes, and calculating and storing a positional difference therebetween;
   unloading the dummy substrate from the mount;
   loading the wafer onto the mount;
   compensating for the positional difference by moving the mount with the wafer thereon, in relation to the probes; and
   inspecting the electrical characteristics of each chip on the wafer by bringing the probes into contact with the electrode portions of each chip.

2. A method according to claim 1, wherein the reference position of the probes is a first reference position defined by the position of the electrode portions of a chip.

3. A method according to claim 2, wherein when the same probe card or another probe card of the same kind as a probe card which has already been used is used during a subsequent inspection, the reference position of the probes is a second reference position formed by combining the positional difference with the first reference position.

4. A method according to claim 1, wherein the dummy substrate is a semiconductor wafer whose surface is coated with aluminum.

5. A method of inspecting electrical characteristics of semiconductor chips on a wafer by use of a probe apparatus which has a mount for mounting the wafer and moving it in first and second directions perpendicular to each other, on a plane parallel to the main surface of the wafer, and a probe card having probes arranged in correspondence to electrode portions of each chip, the method comprising the steps of:

loading a dummy substrate onto the mount;
   forming probe marks by the probes on the dummy substrate by bringing the probes into contact therewith;
   imaging the probe marks in order to obtain a probe mark image;
   comparing the real position of the probes obtained from the probe mark image with a prestored reference position of the probes, and calculating and storing a positional difference therebetween;

unloading the dummy substrate from the mount;

loading the wafer onto the mount;

compensating for the positional difference by moving the mount with the wafer thereon, in relation to the probes; and inspecting the electrical characteristics of each chip on the wafer by bringing the probes into contact with the electrode portions of each chip.

6. A method according to claim 5, wherein a single probe card is used for inspecting plural kinds of wafers, and all the steps are carried out each time, on each kind of wafer to be inspected.

7. A method according to claim 6, wherein the reference position of the probes is a first reference position defined by the position of the electrode portions.

8. A method according to claim 7, wherein when another wafer of the same kind as the wafer which has already been inspected is inspected after a wafer of a different kind is inspected, the reference position of the probe is a second reference position, formed by combining the positional difference with the first reference position.

9. A method according to claim 5, wherein the dummy substrate is a semiconductor wafer whose surface is coated with aluminum.

* * * * *